US012693311B2

(12) United States Patent
Krause et al.

(10) Patent No.: US 12,693,311 B2
(45) Date of Patent: Jul. 28, 2026

(54) DEVICE FOR HANDLING A TEST CONTACT

(71) Applicant: Pac Tech—Packaging Technologies GmbH, Nauen (DE)

(72) Inventors: Thorsten Krause, Hoppegarten (DE); Andreas Meinecke, Berlin (DE); Christopher Schulz, Ketzin (DE); Wladimir Motorin, Kremmen (DE)

(73) Assignee: PAC TECH—PACKAGING TECHNOLOGIES GMBH, Nauen (DE)

( * ) Notice: Subject to any disclaimer, the term of this patent is extended or adjusted under 35 U.S.C. 154(b) by 167 days.

(21) Appl. No.: 18/610,652

(22) Filed: Mar. 20, 2024

(65) Prior Publication Data

US 2024/0337677 A1    Oct. 10, 2024

(30) Foreign Application Priority Data

Apr. 4, 2023    (DE) ..................... 10 2023 108 561.1

(51) Int. Cl.
| | |
|---|---|
| *G01R 1/067* | (2006.01) |
| *G01R 1/04* | (2006.01) |
| *G01R 1/073* | (2006.01) |
| *G01R 3/00* | (2006.01) |
| *G01R 31/28* | (2006.01) |

(52) U.S. Cl.
CPC ........... *G01R 1/06733* (2013.01); *G01R 3/00* (2013.01)

(58) Field of Classification Search
CPC .......... G01R 1/04; G01R 1/067; G01R 1/073; G01R 3/00; G01R 31/28
See application file for complete search history.

(56) References Cited

U.S. PATENT DOCUMENTS

| | | |
|---|---|---|
| 4,965,865 A | 10/1990 | Trenary |
| 2011/0089963 A1 | 4/2011 | Azdasht |

(Continued)

FOREIGN PATENT DOCUMENTS

| | | |
|---|---|---|
| DE | 102008051853 A1 | 4/2010 |
| JP | S63151875 A | 6/1988 |

(Continued)

OTHER PUBLICATIONS

Taiwan Patent Office, Office Action, Application No. 113109161, Oct. 14, 2024, 11 pages.

(Continued)

*Primary Examiner* — Neel D Shah
(74) *Attorney, Agent, or Firm* — Quarles & Brady LLP

(57) ABSTRACT

A device for handling a test contact in which the device includes a contact head provided with a test contact receptacle at its contact end, the test contact receptacle having a positioning unit having at least two, preferably three, positioning surfaces for coming into positioning contact with a test contact and for positioning the test contact relative to the contact end of the contact head. The at least one positioning surface of the positioning unit being formed as a base contact surface and at least one more positioning surface of the positioning unit being formed as an edge contact surface. Furthermore, a manufacturing system is also provided for manufacturing a test contact arrangement for testing semiconductor components.

13 Claims, 3 Drawing Sheets

(56)          References Cited

U.S. PATENT DOCUMENTS

| | | | |
|---|---|---|---|
| 2011/0235681 A1 | 9/2011 | Azdasht | |
| 2013/0162278 A1* | 6/2013 | Chung et al. | |
| 2018/0052188 A1* | 2/2018 | Rowe ................. | G01R 31/2891 |
| 2018/0259554 A1* | 9/2018 | Krause .............. | G01R 1/06705 |
| 2020/0292576 A1 | 9/2020 | Perego | |

FOREIGN PATENT DOCUMENTS

| | | | |
|---|---|---|---|
| JP | 2009068967 A | 4/2009 | |
| JP | 2010203962 A | 9/2010 | |
| JP | 2010261841 A | 11/2010 | |
| JP | 2011117758 A | 6/2011 | |
| KR | 102248916 B1 | 5/2021 | |
| TW | 201823728 A | 7/2018 | |
| TW | 202223407 A | 6/2022 | |
| WO | 2022122866 A1 | 6/2022 | |

OTHER PUBLICATIONS

Japan Patent Office, Notice of Reasons for Refusal, Application No. 2024-049363, May 7, 2025, 10 pages.
Korean Intellectual Property Office, Notice of Rejection, Application No. 10-2024-0040924, Apr. 29, 2025, 12 pages.

* cited by examiner

DEVICE FOR HANDLING A TEST CONTACT

CROSS-REFERENCE TO RELATED APPLICATION

This application claims priority to German Patent Application No. 10 2023 108 561.1 filed Apr. 4, 2023, the disclosure of which is incorporated herein by reference in its entirety for all purposes.

TECHNICAL FIELD

The present disclosure relates to a device for handling a test contact having a contact head provided with a test contact receptacle at its contact end, the test contact receptacle having a positioning unit having at least two positioning surfaces for coming into positioning contact with a test contact and for positioning the test contact relative to the contact end of the contact head, at least one positioning surface of the positioning unit being formed as an edge contact surface and at least one more positioning surface of the positioning unit being formed as a base contact surface. Furthermore, this disclosure comprises a system having at least one test contact and an embodiment of the device.

BACKGROUND

It is known that test contacts are used for manufacturing test contact arrangements with a plurality of test contacts on a shared testing platform. The test contacts are situated in a matrix arrangement according to the chips disposed in a wafer assembly, such that the individual chips on the wafer plane can be contacted in a defined manner via the individual test contacts.

For manufacturing a test contact arrangement, the individual test contacts are disposed on a contact carrier realized as a test board according to the intended matrix arrangement of the contact arms or contact tips of the individual test contacts and are soldered on contact surfaces formed on the test board. Because of the high concentration of the test contacts on each test board and the resulting short distance between the test contacts, the requirements for an electrically reliable and exactly positioned alignment and contacting of the test contacts on the test board are particularly high. For an exact alignment and contacting of the test contacts on the test board, high precision is required as early as when the test contacts are received on the contact head of a device for handling a test contact. Different embodiments of devices for handling a test contact are known. For example, devices for manufacturing a test contact arrangement are known, whose test contact receptacle applies a negative pressure to the test contact for mounting and handling. For aligning the test contact relative to the contact head, it is known to bring a top edge of the test contact into contact with a stop of the contact head or the test contact receptacle. However, for each test contact design, known devices for handling test contacts require a different device or test contact receptacle tailored to the respective test contact. In other words, for each geometrically deviating test contact it is necessary to also redesign and replace the test contact receptacle.

SUMMARY

In the light of the aforementioned circumstances, an object of the present invention is to propose a device which overcomes the disadvantages of the state of the art regarding the receiving of test contacts. In particular, an object is to propose a device for a precise and reliable handling and receiving of test contacts which can be used universally, such that a plurality of different test contacts can be received.

The invention also relates to all combinations comprising at least two features disclosed in the description, the claims and/or the figures. Needless to say, the remarks regarding the device equivalently relate to the system according to the invention without being mentioned separately in its context. In particular, linguistically common rephrasing and/or an analogous replacement of respective terms within the scope of common linguistic practice, in particular the use of synonyms backed by the generally recognized linguistic literature, are of course comprised by the content of the disclosure at hand without every variation having to be expressly mentioned.

In a first aspect, the invention relates to a device for handling a test contact having a contact head provided with a test contact receptacle at its contact end, the test contact receptacle having a positioning unit having at least two, preferably three, positioning surfaces for coming into positioning contact with a test contact and for positioning the test contact relative to the contact end of the contact head. The device is characterized in that the at least one positioning surface of the positioning unit is formed as an edge contact surface and at least one more positioning surface of the positioning unit is formed as a base contact surface. Thus, the device advantageously allows a precise and directed arrangement of the test contact relative to the contact head by means of the positioning of a test contact with the basis of the test contact on a base contact surface and with another edge of the test contact on an edge contact surface. Within the scope of the invention, the edge contact surface is a surface which is different to the base contact surface and which preferably does not coincide with the base contact surface and, more preferably, which is disposed at a distance to the base contact surface. Even more preferably, the edge contact surface and the base contact surface are disposed at a predetermined angle to each other. For example, the edge contact surface can be perpendicular, i.e., at an angle of 90°, relative to the base contact surface. A design having at least three positioning surfaces advantageously allows the test contact to be received in the test contact receptacle particularly precisely. Additionally, the base contact surface and the edge contact surfaces can be disposed to each other such that the upper surface of the base contact surface does not end with an edge contact surface, but instead, the edge contact surfaces are rather disposed on the side of the base contact surface. Within the scope of the invention, the terms "upper", "lower", "above", "below", and "upper surface" and "lower surface" refer to the device for handling a test contact in a position of use. Preferably, the aforementioned terms relate to the vertical spatial expansion, if the device is in a position of use. Within the scope of the invention, the term "surface" preferably refers to a flat surface. The base contact surface is preferably rectangular.

To correctly receive a test contact, the fastening base of the test contact can be brought into direct contact with the base contact surface. The base contact surface is designed such that the test contact is brought into full contact with the base contact surface. The base contact surface is preferably designed complementarily to the fastening base. The fastening base is preferably formed in the manner of a rectangular plate. The edge contact surface fixes the test contact relative to the base contact surface, on which the test contact is displaceable until it comes into contact with the edge contact surface. After the test contact is brought into contact with both the base contact surface and the edge contact surface, a movement of the test contact is preferably disabled in at least two directions.

Within the scope of the invention, it has been discovered that the positioning unit must be designed essentially complementarily to the test contact, however, the positioning surfaces can be disposed to each other such that a plurality of different test contacts can be received by the device according to the invention. To this end, in particular the positioning surfaces can be disposed to each other such that the total width, the total height and/or the material thickness of the test contact to be received is not restricted or limited by the positioning unit.

At hand, the wording "at least one" means that the device according to the invention can comprise one or more of the corresponding components or surfaces.

According to a preferred embodiment, the positioning unit has at least one stop edge, which forms the edge contact surface which is preferably oriented perpendicular to the base contact surface. Advantageously, by forming a physical stop edge, the movement of the test contact is reliably disabled in at least one direction when said test contact is in contact with the edge contact surface formed by the stop edge and a defined stop surface is formed. Preferably, the positioning unit comprises two stop edges in order to prevent a wedging or canting and thus an incorrect positioning. The stop edge is preferably configured such that the edge contact surface is oriented perpendicular to the base contact surface. As a result, a base of the test contact can be brought into contact with the base contact surface and a side edge of the test contact can be brought into contact with the stop edge. Preferably, the stop edge and thus also the edge contact surface is disposed below the upper surface of the base contact surface, such that the device can be used universally since the height of the test contact to be received is not limited by the positioning unit.

The stop edge can have an edge thickness which is equal to the material thickness of the test contact or greater than the material thickness of the test contact. By means of such a configuration of the stop edge, an edge of the test contact, which is to be brought into contact with the stop edge, can be supported over the entire material thickness of the test contact and can thus be supported very stably.

It is conceivable that a stop body protruding from the base contact surface comprises the stop edge. In other words, the stop edge is formed on a stop body protruding from the base contact surface. Within the scope of the invention, the term "protruding" means that the stop body projects parallel to and/or in the direction of the normal of the base contact surface.

For spacing apart the stop edge and the edge contact surface from the base contact surface, the stop body can have at least two legs. The stop body preferably has two legs. In other words, the stop body is L-shaped. It is conceivable that a first leg next to the base contact surface projects laterally from the base contact surface and a second leg is oriented perpendicular to the base contact surface. The edge contact surface or the stop edge can be formed on the second leg which is oriented perpendicular to the base contact surface. The legs are preferably directly connected to each other. More preferably, the first leg is directly adjacent to the base contact surface.

According to a preferred embodiment, the positioning unit has at least one stop body on either side of the base contact surface, allowing for an exact and stable positioning of the test contact on the positioning unit. The stop bodies can be disposed on either side of the base contact surface such that the positioning unit at least partially has an essentially U-shaped cross section.

To increase the contact surface of the test contact on the positioning unit, it is conceivable that the positioning unit comprises a contact body laterally projecting from the base contact surface. Preferably, an edge of the contact body forms an additional contact surface which is disposed in the same plane as the base contact surface. Thus, the contact surface of the test contact can advantageously be enlarged, thereby stabilizing the test contact on the positioning unit. Preferably, the positioning unit has two contact bodies which laterally project from the base contact surface. More preferably, the two contact bodies are disposed on either side of the base contact surface.

In a preferred embodiment, it is conceivable that the base contact surface has a base contact surface height, the stop body has a stop body height and the contact body has a contact body height, the base contact surface height being greater than the stop body height and/or greater than the sum of the stop body height and the contact body height. To provide a clearer illustration, the following preferably applies:

$$h_{BA} > h_{AK}$$

and/or $$h_{BA} > h_{AK} + h_{ANL}$$

with
$h_{BA}$: base contact surface height,
$h_{AK}$: stop body height,
$h_{ANL}$: contact body height,
particularly preferably both conditions being fulfilled.

In another embodiment of the invention, it is conceivable that the positioning unit has a total width and the base contact surface has a base contact surface width, the base contact surface width being less than the total width. Within the scope of the invention, it has been discovered that in order for the test contact to be received reliably, the base contact surface width must be coordinated with the total width of the positioning unit. According to the invention, the test contact is brought into full contact with the base contact surface. In particular in order to design the device so as to be universally useable regarding different test contacts, further elements of the positioning unit, such as stop bodies or contact bodies, which increase the total width of the positioning unit, can be formed on either side of the base contact surface. In particular if stop bodies are provided on either side of the base contact surface, it is easily possible to position the test contact relative to the test contact receptacle by bringing the base of the test contact into contact with the base contact surface and by sliding said base of the test contact at least partly between the stop bodies until an edge of the test contact is brought into contact with the edge contact surface of the stop bodies. Preferably, the total width is composed of the width of the stop bodies and/or the contact bodies and the base contact surface width. It is conceivable that the stop bodies and the contact bodies have the same width. The terms "base contact surface width" and "total width" both relate to the spatial expansion parallel to the lower edge of the test contact receptacle or the contact head. Preferably, the aforementioned terms relate to the horizontal spatial expansion, if the device is in a position of use.

In one embodiment of the invention, it is conceivable that the positioning unit is formed in one piece in order to save connection points and/or assembly steps. Preferably, the positioning unit is formed integrally with the test contact receptacle and/or the contact head. In other words, this means that the contact head, the test contact receptacle and the positioning unit are preferably formed in one piece. However, it is also conceivable that the contact head, the test contact receptacle and the positioning unit are realized by multiple pieces, said pieces more preferably being detachably connected in order to allow an easy replacement of the positioning unit.

According to a preferred embodiment, the contact head has at least one transmission channel for transmitting thermal energy and/or to transfer a negative pressure, the contact end of the contact head being provided with the test contact receptacle in the area of a channel mouth of the transmission channel. If the contact head has a transmission channel for transmitting thermal energy, given that the test contact is disposed relative to the channel mouth in a defined manner, thermal energy can be advantageously introduced discreetly into a desired absorption area of the test contact in order to allow the test contact to be disposed on a contact carrier in a reliable and distortion-free manner. If the contact head has at least one transmission channel to transfer a negative pressure, the test contact can be easily and reliably mounted by means of a negative pressure on the contact head after it has been disposed relative to the contact head by means of the positioning unit. Preferably, the contact head has at least one transmission channel for transmitting thermal energy and to transfer a negative pressure. Within the scope of the invention, it has been discovered that a single transmission channel may be used advantageously for transmitting thermal energy and also to transfer a negative pressure. The channel mouth is preferably formed by an outlet funnel of the transmission channel and has an opening cross section which is dimensioned according to the absorption cross section of the absorption area of the test contact. A corresponding geometric design of the channel mouth allows the absorption area of the test contact to be provided with a defined surface of the test contact using relatively little technical effort.

According to an advantageous embodiment, the base contact surface of the positioning unit at least partly encloses an opening cross section of the channel mouth. Thus, it can be ensured that the energy input into the base required for the contacting can take place and/or that the base of the test contact is reliably fixed to the test contact receptacle during the manufacture of a test contact arrangement. Preferably, the base contact surface of the positioning unit fully surrounds the opening cross section of the channel mouth, whereby the absorption area of the test contact is disposed within the outlet funnel of the channel mouth, and therefore thermal energy can be applied easily to a relatively large part of the test contact surface, and/or the fact that the test contact fully covers the opening cross section allows the test contact to be mounted by means of the application of a negative pressure.

In a second aspect, the invention relates to a manufacturing system for manufacturing a test contact arrangement for testing and/or manufacturing semiconductor components using a device according to any embodiment of the invention and having at least one test contact formed in the manner of a cantilever, the test contact having a fastening base which can establish contact with the base contact surface and a contact arm which is connected to the fastening base. Preferably, a contact tip is disposed on the free end of the contact arm. In addition to manufacturing a test contact arrangement, the manufacturing system can also be used to repair a test contact arrangement, the person skilled in the art being aware that a test contact can also be received and handled in the required alignment even for repairing a test contact arrangement.

According to an advantageous embodiment of the manufacturing system, the test contact and the device for handling a test contact interact such that the fastening base of the test contact covers the channel mouth of the transmission channel when the test contact establishes contact with the base contact surface. Preferably, the test contact fully closes the channel mouth when the test contact is brought into contact with the base contact surface of the positioning unit. Thus, the test contact can be mounted easily on the positioning unit by applying a negative pressure to the test contact via the transmission channel.

According to a preferred embodiment of the manufacturing system, the test contact has a projection disposed below the contact arm, the projection being able to establish contact with the edge contact surface and/or the projection being able to establish contact with the contact body. The projection of the contact arm can be brought into contact with the stop edge of the stop body, on which the edge contact surface is formed. By means of the stop on the stop edge, the test contact can be oriented easily on the positioning unit. The contact surface of the test contact on the positioning unit can be enlarged if the projection of the test contact is brought into contact with the contact body. Preferably, a projection is disposed on either side of the base of the test contact. More preferably, the projection can be brought into contact with both the edge contact surface and the contact body. Most preferably, the test contact has two projections which are disposed on either side of the base of the test contact and the positioning unit also has two stop bodies and two contact bodies, which are each disposed on either side of the base contact surface of the positioning unit, each projection of the test contact being brought into contact with one contact body and one stop body of the positioning unit each in order to allow a particularly precise alignment of the test contact. Because of the test contact being formed essentially cross-shaped with a cantilever projecting from the top edge and the top edge not having to be brought into contact with a stop, since the projections of the test contact can be brought into contact with a stop edge of the positioning unit, the positioning unit can be used flexibly and universally, in particular because the height of the test contact to be positioned is not limited.

It is obvious that the embodiments and the illustrative examples described above and yet to be explained below can be realized not only individually but also in any combination without departing from the scope of the present invention. It is also obvious that the embodiments and the illustrative examples described above and yet to be explained below relate to the manufacturing system according to the invention and/or the device in an equivalent or at least in a similar manner without having to be mentioned separately.

BRIEF DESCRIPTION OF THE FIGURES

Embodiments of the invention are schematically illustrated in the drawings and are described in an exemplary manner hereinafter.

DETAILED DESCRIPTION

Figure 1:
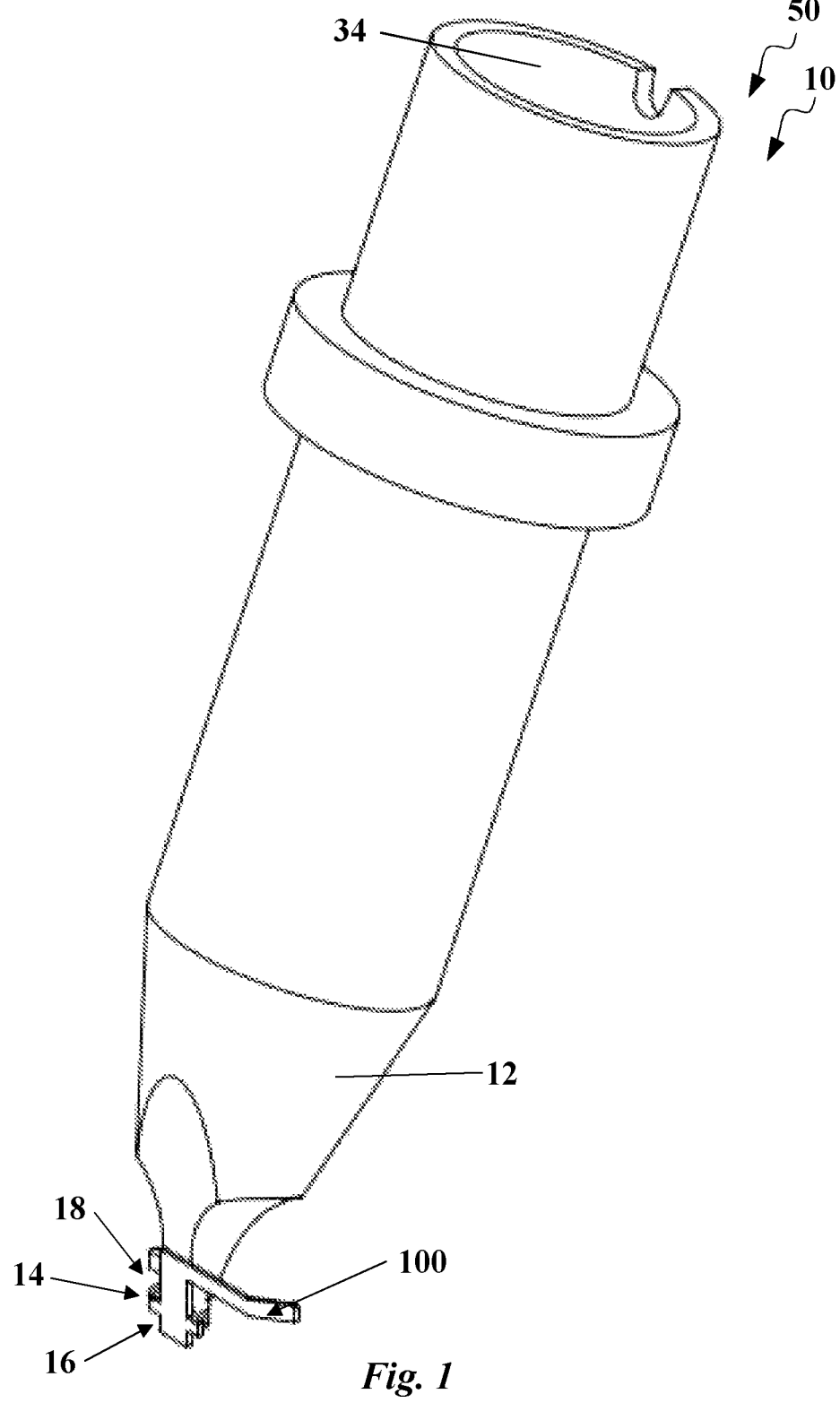
FIG. 1 shows an isometric view of a schematic illustrative example of a device according to the invention with received test contact.

FIG. 1 shows a device 10 according to the invention for handling a test contact 100 having a test contact 100 according to the invention, whereby a manufacturing system 50 is formed. For receiving the test contact 100, test contact receptacle 14 having positioning unit 18 is disposed on contact end 16 of contact head 12. To mount test contact 100 on positioning unit 18, test contact 100 can be subjected to a negative pressure via transmission channel 34.

Figures 2, 3:
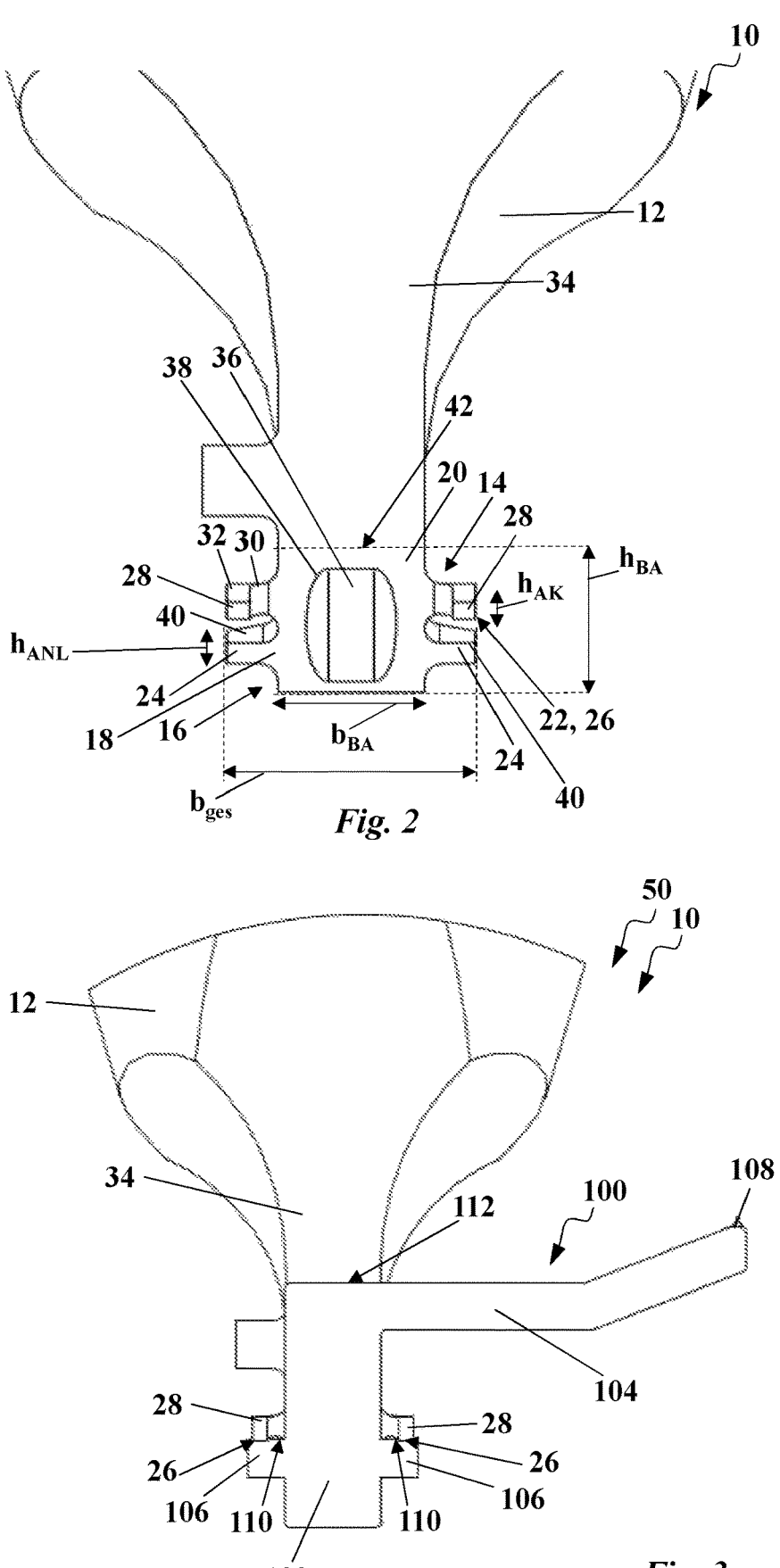
FIG. 2 shows a detailed front view of the device according to the invention according to FIG. 1 without test contact.
FIG. 3 shows a detailed front view of the device according to the invention according to FIG. 1.

FIG. 2 shows a device 10 according to the invention for handling a test contact 100. For receiving test contact 100, test contact receptacle 14 is disposed on contact end 16 of contact head 12. Test contact receptacle 14 comprises a positioning unit 18, which has a base contact surface 20, an edge contact surface 22 and an additional contact surface 24. A test contact 100 can be brought into contact with positioning unit 18 in such a manner that test contact 100 is brought into full contact with base contact surface 20 and also with additional contact surfaces 24 on either side of base contact surface 20. In order to block a vertical shift of test contact 100 in the present illustrative example, in this case equivalent to the longitudinal extension of transmission channel 34, positioning unit 18 has two stop bodies 28, which are disposed on either side of base contact surface 20, in addition to contact bodies 36 projecting on either side, said stop bodies 28 each forming an edge contact surface 22 with which an edge of test contact 100 can be brought into contact. According to the shown illustrative example, edge contact surface 22 is oriented perpendicular to base contact surface 20 and faces downward in the shown position of use. Stop body 28 forming edge contact surface 22 is essentially L-shaped in the present embodiment and has legs 30, 32, first leg 30 laterally projecting from base contact surface 20 and second leg 32 projecting from the plane of base contact surface 20. Thus, a test contact 100 can be positioned easily on positioning unit 18 by applying said test contact 100 to base contact surface 20 and sliding it until it reaches stop body 28. For mounting test contact 100 on positioning unit 18, a negative pressure can be applied to test contact 100 via transmission channel 34. As can be seen in a combined view of FIGS. 2 and 3, test contact 100 fully closes channel mouth 36 of transmission channel 34 when said test contact 100 is brought correctly into contact with positioning unit 18 because base contact surface 20 fully surrounds opening cross section 38 of channel mouth 36. Thus, test contact 100 can be easily mounted on positioning unit 18 by means of a negative pressure. Furthermore, FIG. 2 shows that height $h_{BA}$ of base contact surface 20 is greater than the sum of height $h_{AK}$ of stop body 28 and height $h_{ANL}$ of contact body 40. Furthermore, it can be seen that both stop body 28 and contact body 40 are disposed below upper surface 42 of base contact surface 20, contact body 40 also being disposed below stop body 28. In the present embodiment, total width $b_{ges}$ of positioning unit 18 results from the width of contact body 40 and width $b_{BA}$ of base contact surface 20, contact body 40 and stop body 28 having the same width in the present illustrative example.

Figure 4:
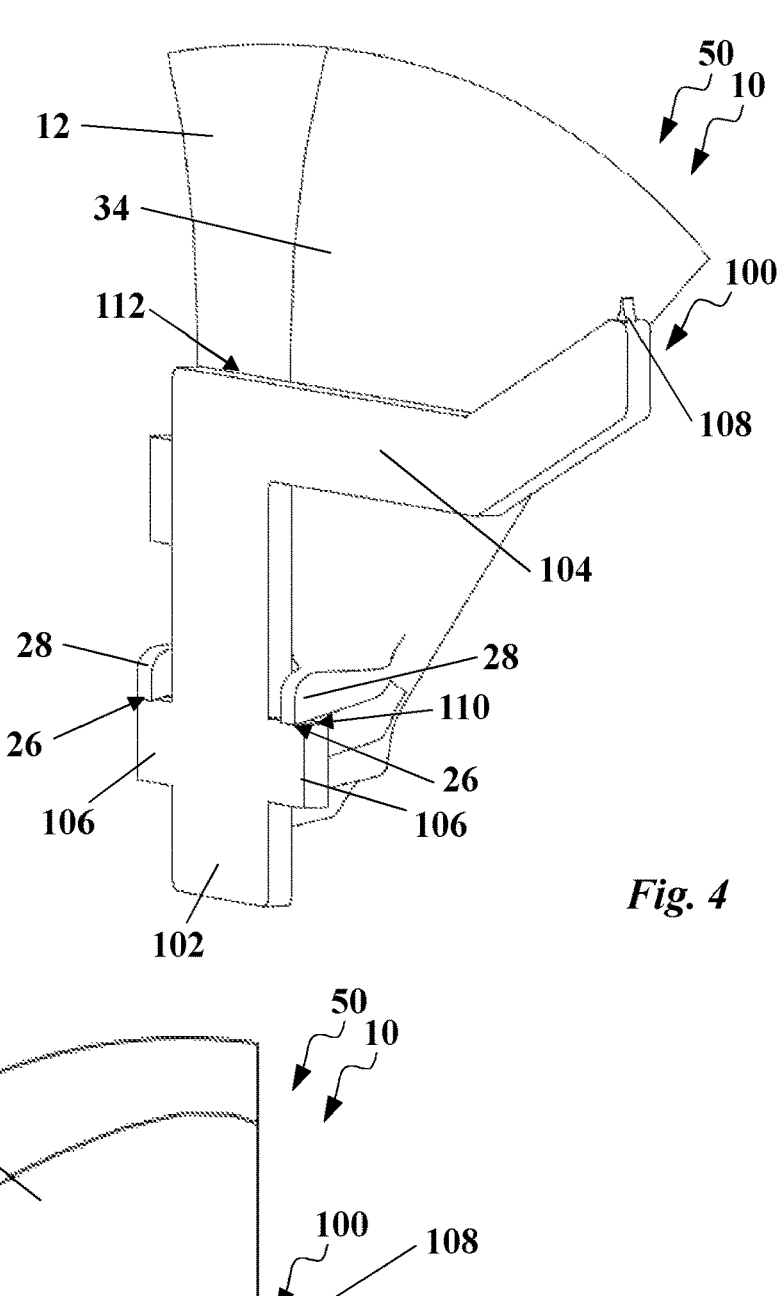
FIG. 4 shows a detailed isometric view of the device according to the invention according to FIG. 1.
Figure 5:
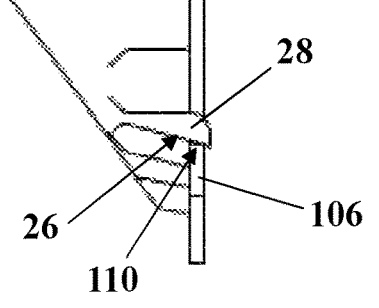
FIG. 5 shows a detailed lateral view of the device according to the invention according to FIG. 1.

FIGS. 3 to 5 show a device 10 according to the invention for handling a test contact 100 having a test contact 100 according to the invention, whereby a manufacturing system 50 is formed. Test contact 100 has a fastening base 102 and two projections 106 disposed on either side of fastening base 102. In the upper area of fastening base 102, a projecting contact arm 104 is disposed, the top edge of contact arm 104 laterally prolonging the top edge of fastening base 102, said top edge forming test contact top edge 112. Fastening base 102 with projections 106 of test contact 100 is formed essentially cross-shaped with a contact arm 104 projecting from test contact top edge 112. A contact tip 108, which can be used for contacting, is disposed on contact arm 104. From a combined view with FIG. 2, it can be seen that fastening base 102 of test contact 100 is brought into contact with base contact surface 20 of positioning unit 18 in FIGS. 3 to 5. Furthermore, projections 106 are brought into full contact with additional contact surfaces 24 of contact body 40. Each projection stop edge 108 of projections 106 is brought into contact with stop edge 26 of stop body 28. For positioning test contact 100 relative to contact head 12 by means of positioning unit 18, test contact top edge 112 is not required to come into contact with a stop because top edges 110 of projections 106 of test contact 100 can be brought into contact with a stop edge 26 of stop body 28. Thus, device 10 and in particular positioning unit 18 can be used flexibly and universally, in particular because the height of test contact 100 to be positioned is not limited. It can be seen, in particular from FIGS. 4 and 5, that stop edge 26 has an edge thickness which is greater than the material thickness of test contact 100 in order to ensure that test contact 100 reliably rests on stop body 28. Furthermore, it can be seen from a combined view of FIGS. 3 to 5 with FIG. 2 that channel mouth 36 of transmission channel 34, which is inserted in contact head 12, is closed by means of test contact 100, if said test contact 100 correctly abuts against positioning unit 18, in such a manner that test contact 100 can be mounted on positioning unit 18 when a negative pressure is applied via transmission channel 34 and, consequently, can be moved to the intended position for contacting test contact 100.

What is claimed is:

1. A device for handling a test contact, the device comprising a contact head provided with a test contact receptacle at its contact end, the test contact receptacle having a positioning unit having at least two positioning surfaces for coming into positioning contact with a test contact and for positioning the test contact relative to the contact end of the contact head, wherein the at least one positioning surface of the positioning unit is formed as a base contact surface and at least one more positioning surface of the positioning unit is formed as an edge contact surface, wherein a stop body protruding from the base contact surface comprises a stop edge and the stop edge forms the edge contact surface, and wherein the stop body has at least two legs.

2. The device for handling a test contact according to claim 1, wherein the edge contact surface is oriented perpendicular to the base contact surface.

3. The device for handling a test contact according to claim 2, wherein the stop edge has an edge thickness which is equal to the material thickness of the test contact or greater than the material thickness of the test contact.

4. The device for handling a test contact according to claim 1, wherein the positioning unit has at least one stop body on either side of the base contact surface.

5. The device for handling a test contact according to claim 1, wherein the positioning unit comprises a contact body laterally projecting from the base contact surface.

6. The device for handling a test contact according to claim 1, wherein the base contact surface has a base contact surface height, the stop body has a stop body height and the contact body has a contact body height, the base contact surface height being greater than the stop body height and/or greater than the sum of the stop body height and the contact body height.

7. The device for handling a test contact according to claim 1, wherein the positioning unit has a total width and the base contact surface has a base contact surface width, the base contact surface width being less than the total width.

8. The device for handling a test contact according to claim 1, wherein the positioning unit is formed in one piece.

9. The device for handling a test contact according to claim 1, wherein the contact head has at least one transmission channel for transmitting thermal energy and/or to transfer a negative pressure, the contact end of the contact head being provided with the test contact receptacle in the area of a channel mouth of the transmission channel.

10. The device for handling a test contact according to claim 9, wherein the base contact surface of the positioning unit at least partly encloses an opening cross section of the channel mouth.

11. A manufacturing system for manufacturing a test contact arrangement for testing semiconductor components using a device according to claim 1 and having at least one test contact formed in the manner of a cantilever, the test contact having a fastening base which can establish contact with the base contact surface and a contact arm which is connected to the fastening base.

12. The manufacturing system according to claim 11, wherein the fastening base of the test contact covers the channel mouth when contact is established with the base contact surface.

13. The manufacturing system according to claim 11, wherein the test contact has a projection disposed below the contact arm, the projection being able to establish contact with the edge contact surface and/or the projection being able to establish contact with the contact body.

* * * * *